(12) United States Patent
Irving et al.

(10) Patent No.: US 6,826,456 B1
(45) Date of Patent: Nov. 30, 2004

(54) SYSTEM AND METHOD FOR CONTROLLING SERVER CHASSIS COOLING FANS

(75) Inventors: Guy B. Irving, The Woodlands, TX (US); Stephen P. Rousset, The Woodlands, TX (US); David M. Kirkeby, Fullerton, CA (US)

(73) Assignee: RLX Technologies, Inc., The Woodlands, TX (US)

( * ) Notice: Subject to any disclaimer, the term of this patent is extended or adjusted under 35 U.S.C. 154(b) by 216 days.

(21) Appl. No.: 09/848,999

(22) Filed: May 4, 2001

(51) Int. Cl.[7] .............................................. G06F 19/00
(52) U.S. Cl. ...................... 700/299; 700/300; 700/301; 702/130; 702/131; 702/132; 301/158; 361/695
(58) Field of Search ................................ 700/300, 301, 700/304; 702/132, 130, 131; 301/158; 318/471, 472; 361/695

(56) References Cited

U.S. PATENT DOCUMENTS

| | | | | |
|---|---|---|---|---|
| 4,500,821 A | * | 2/1985 | Bitting et al. ............... | 318/254 |
| 4,817,865 A | * | 4/1989 | Wray ......................... | 236/49.3 |
| 4,964,065 A | * | 10/1990 | Hicks et al. ................ | 709/226 |
| 5,408,616 A | | 4/1995 | Murr .......................... | 395/325 |

(List continued on next page.)

OTHER PUBLICATIONS

Irving, et al., U.S. patent application No. 09/848,816, entitled "*Server Chassis Hardware Master System and Method*", filed May 4, 2001.

Irving, Guy B., U.S. patent application No. 09/848,807 entitled "*Embedded Server Chassis Hardware Master System and Method*", filed May 4, 2001.

*Primary Examiner*—Leo Picard
*Assistant Examiner*—Michael D. Masinick
(74) *Attorney, Agent, or Firm*—Baker Botts L.L.P.

(57) ABSTRACT

A system and method for controlling server chassis cooling fans includes monitoring operating temperatures associated with each of a plurality of temperature sensors. The temperature sensors may be coupled with a plurality of respective server processing cards. In accordance with a particular embodiment of the present invention, the operating speed of each of a plurality of server chassis cooling fans coupled with a server chassis is increased, in response to an operating temperature exceeding a predetermined maximum operating temperature measured at any one of the plurality of temperature sensors. In accordance with another embodiment of the present invention, the operating speed of each of the plurality of server chassis cooling fans is decreased in response to an operating temperature below a predetermined minimum operating temperature measured at each of the plurality of temperature sensors. In still another embodiment, a fan shutdown timer is activated for a predetermined time period at each of the plurality of server processing cards having an operating temperature below the predetermined maximum operating temperature.

15 Claims, 9 Drawing Sheets

U.S. PATENT DOCUMENTS

| | | | |
|---|---|---|---|
| 5,428,752 A | | 6/1995 | Goren et al. ................. 395/325 |
| 5,513,361 A | * | 4/1996 | Young ........................ 713/320 |
| 5,546,272 A | * | 8/1996 | Moss et al. ................. 361/687 |
| 5,666,485 A | | 9/1997 | Suresh et al. .......... 395/185.01 |
| 5,687,079 A | * | 11/1997 | Bauer et al. .................. 700/70 |
| 5,727,928 A | * | 3/1998 | Brown ..................... 417/44.11 |
| 5,731,954 A | * | 3/1998 | Cheon ........................ 361/699 |
| 5,805,403 A | * | 9/1998 | Chemla ...................... 361/103 |
| 5,848,282 A | * | 12/1998 | Kang ........................ 713/323 |
| 5,907,689 A | | 5/1999 | Tavallaei et al. ............ 395/290 |
| 5,987,549 A | | 11/1999 | Hagersten et al. .......... 710/107 |
| 6,037,732 A | * | 3/2000 | Alfano et al. ............... 318/471 |
| 6,065,081 A | * | 5/2000 | Stancil et al. ............... 710/104 |
| 6,101,459 A | * | 8/2000 | Tavallaei et al. ............ 702/132 |
| 6,145,098 A | | 11/2000 | Nouri et al. .................. 714/31 |
| 6,147,465 A | * | 11/2000 | Hollenbeck .................. 318/254 |
| 6,172,611 B1 | * | 1/2001 | Hussain et al. ............. 340/584 |
| 6,204,623 B1 | * | 3/2001 | Levy et al. .................. 318/641 |
| 6,257,832 B1 | * | 7/2001 | Lyszkowski et al. .......... 417/2 |
| 6,298,376 B1 | | 10/2001 | Rosner et al. .............. 709/209 |
| 6,321,175 B1 | * | 11/2001 | Nagaraj ....................... 702/132 |
| 6,324,571 B1 | | 11/2001 | Hacheri ...................... 709/208 |
| 6,325,636 B1 | | 12/2001 | Hipp et al. .................... 439/61 |
| 6,392,372 B1 | * | 5/2002 | Mays, II ..................... 318/254 |
| 6,396,688 B1 | * | 5/2002 | Davies et al. ............... 361/687 |
| 6,411,506 B1 | | 6/2002 | Hipp et al. .................. 361/686 |
| 6,459,589 B2 | | 10/2002 | Manweiler et al. ......... 361/752 |
| 6,470,289 B1 | * | 10/2002 | Peters et al. ................ 702/132 |
| 6,591,324 B1 | | 7/2003 | Chen et al. ................. 710/302 |
| 2002/0020755 A1 | * | 2/2002 | Matsushita ................ 236/49.3 |

* cited by examiner

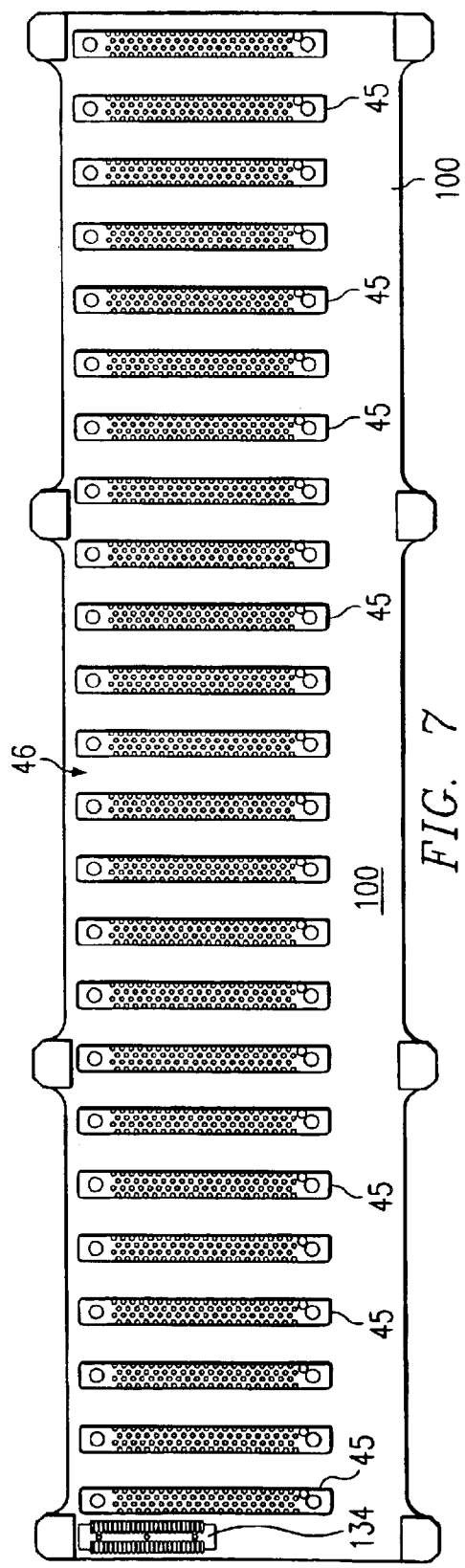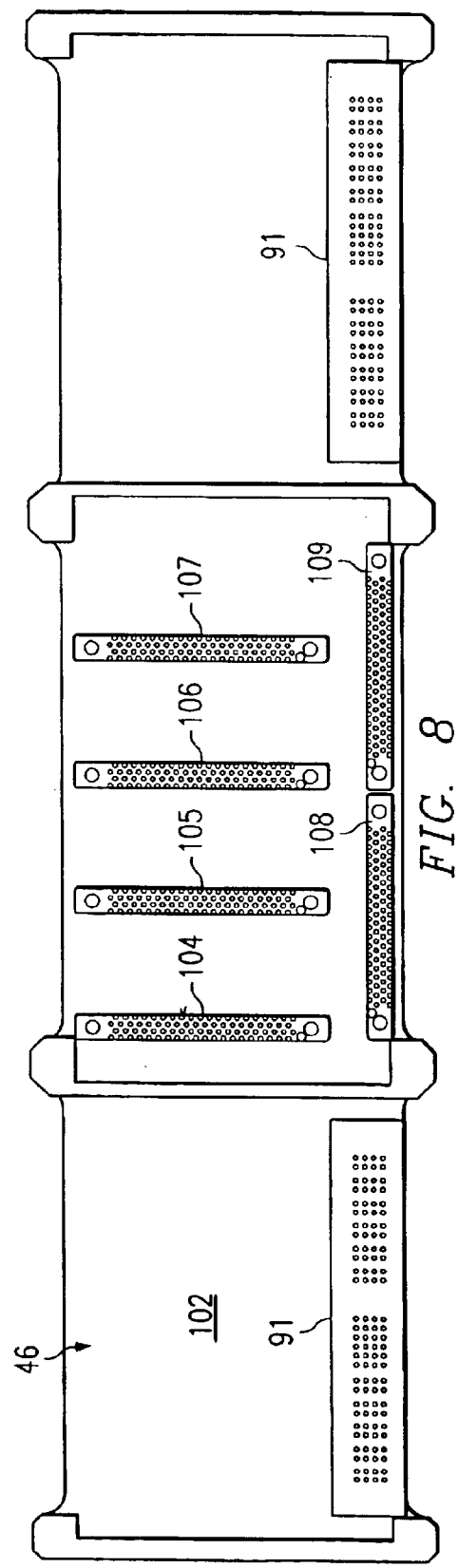

SYSTEM AND METHOD FOR CONTROLLING SERVER CHASSIS COOLING FANS

TECHNICAL FIELD OF THE INVENTION

The present invention relates generally to server chassis communication systems, and more particularly to a system and method for controlling server chassis cooling fans.

BACKGROUND OF THE INVENTION

Network servers are often used for storage of information, communication, and/or to provide access to communication networks including the Internet. Users of network servers are provided the ability to view, access, retrieve and/or store audio, video, data graphics and/or text files. Such files may be displayed to the user via protocols, including, without limitation, hypertext transfer protocol (HTTP). Network servers may include one or more server processing cards coupled with a server chassis. Each server processing card may include software and/or hardware components necessary to perform the functionality of a server.

The density of processors within a given volume of a server chassis has increased over the years in order to meet demands for speed and processing power. Accordingly, many server chassis include cooling fans to provide airflow across server processing cards. Typically, each server processing card includes one or more dedicated cooling fans to provide airflow across that particular server. However, as the size and power requirements of processors is reduced, heat output from each processor is also reduced.

SUMMARY OF THE INVENTION

The present invention provides a system and method for controlling server chassis cooling fans that substantially eliminate or reduce the problems and disadvantages with the previous methods and systems. In accordance with a particular embodiment, a plurality of server processing cards associated with the server chassis each maintain independent control of a plurality of associated server chassis fans. Therefore, the server chassis fans work in parallel to provided cooling to any particular server processing card which detects a "high-temperature" condition.

One aspect of the present invention includes a method for controlling a plurality of server chassis cooling fans wherein operating temperatures associated with each of a plurality of temperature sensors are monitored. The temperature sensors may be coupled with respective server processing cards. The speed of each of a plurality of server chassis cooling fans coupled with a server chassis may be increased in response to a predetermined maximum temperature measured at any one of the plurality of temperature sensors.

In accordance with another aspect of the present invention, the operating speed of the fans may be decreased in response to a predetermined minimum operating temperature measured at each of the plurality of fans. The minimum operating temperature may be equal to the maximum operating temperature. In alternative embodiments, the minimum operating temperature may be less than the maximum operating temperature.

In accordance with yet another embodiment of the present invention, a fan shutdown timer may be activated at each of the plurality of server processing cards having an operating temperature below the predetermined maximum temperature reading.

Still another aspect of the present invention includes decreasing the operating speed of each of the plurality of fans in response to a condition in which:(i) none of the operating temperatures are above the predetermined maximum operating temperature; and (ii) none of the plurality of server processing cards include an active fan shutdown timer.

Technical advantages of particular embodiments of the present invention include a method for controlling a plurality of server chassis fans to cool any particular one of the server processing cards which detects an operating temperature above a predetermined maximum. Accordingly, the number of fans required to cool the servers are reduced, since each server does not require a corresponding server chassis fan.

Another technical advantage.of particular embodiments of the present invention include a plurality of server chassis fans configured to run at approximately the same speed as adjacent server chassis fans.

Accordingly, uneven airflow and uneven cooling of server processing cards is reduced or eliminated.

Still another technical advantage of particular embodiments of the present invention include multiple speed server chassis fans configured to provide maximum cooling when necessary. Therefore, power requirements and noise are reduced when the server chassis fans return to a lower rate of spin in response to acceptable temperature readings.

Other technical advantages of the present invention will be readily available to one skilled in the art from the following figures, descriptions, and claims.

BRIEF DESCRIPTION OF THE DRAWINGS

For a more complete understanding of the present invention and its advantages, reference is now made to the following descriptions, taken in conjunction with the accompanying drawings, in which:

FIG. 7 is a schematic drawing, with portions broken away, illustrating a midplane of the server chassis of FIG. 1, in accordance with a particular embodiment of the present invention;

FIG. 8 is a schematic drawing, with portions broken away, illustrating a rear view of the midplane of FIG. 7, in accordance with another embodiment of the present invention;

DETAILED DESCRIPTION OF THE INVENTION

Figure 1:
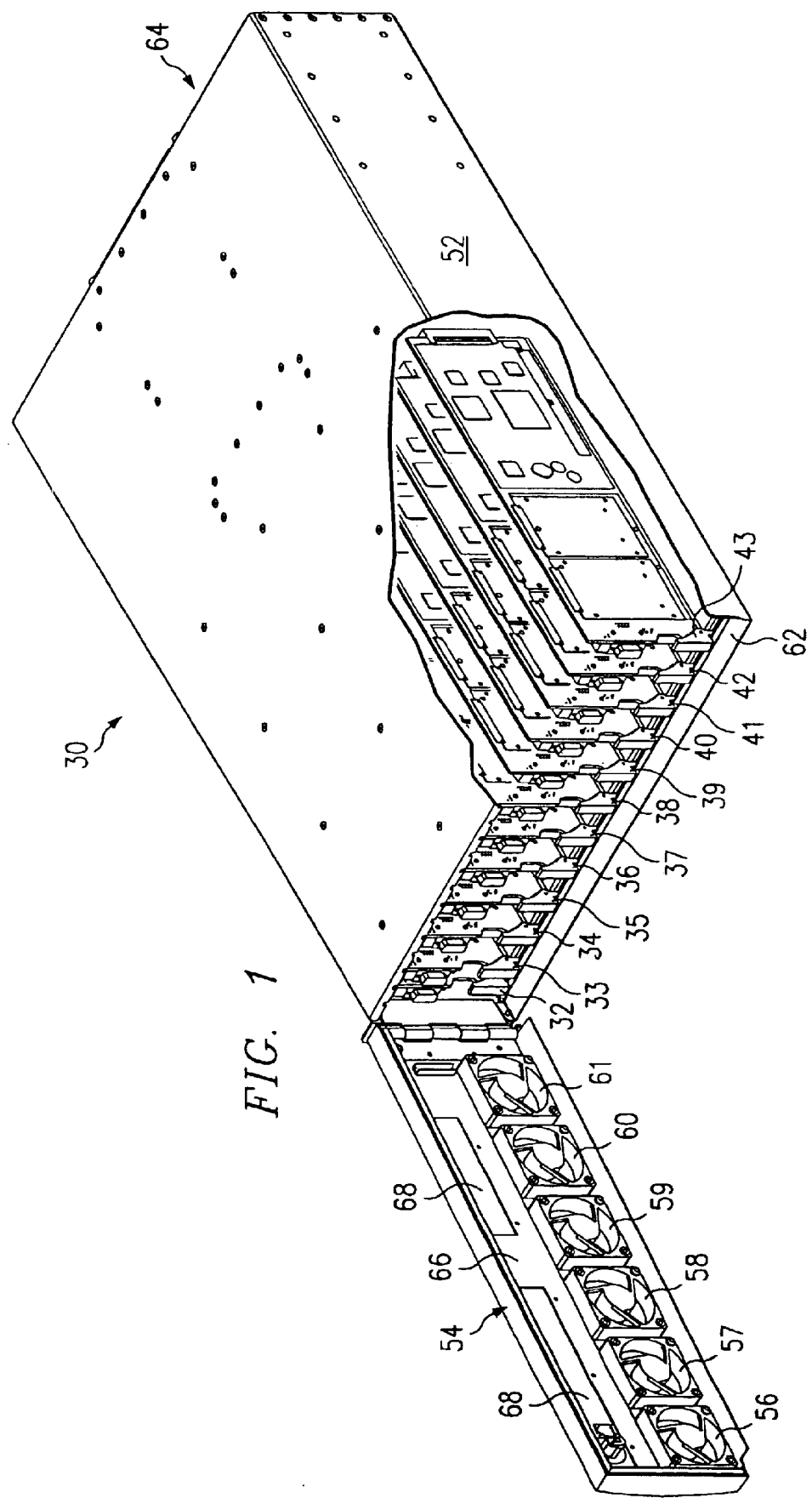
FIG. 1 is an isometric view, with portions broken away, illustrating a server chassis in accordance with a particular embodiment of the present invention.
Figure 2:
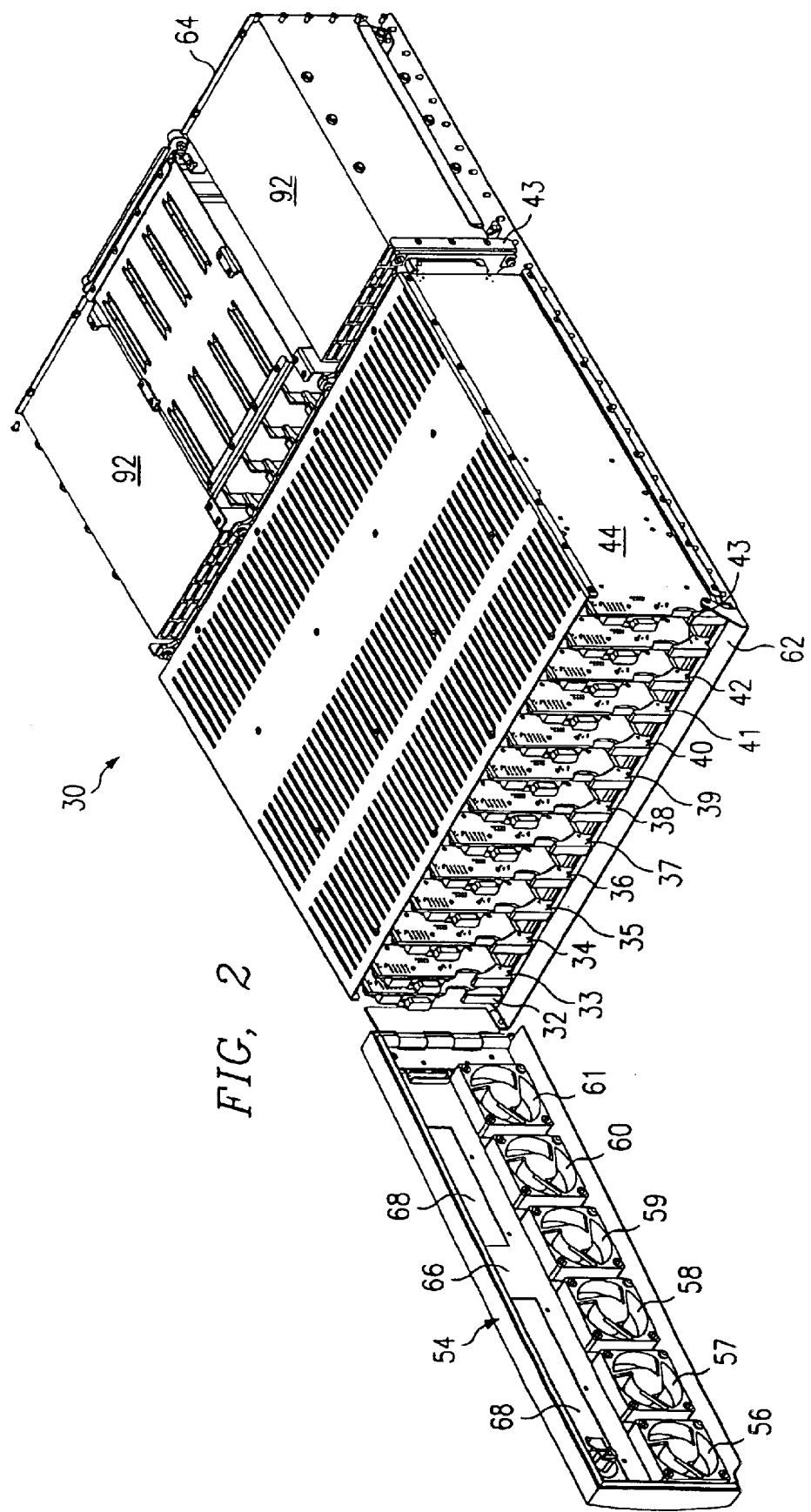
FIG. 2 is an isometric view, with portions broken away, illustrating the server chassis of FIG. 1.
Figure 3:
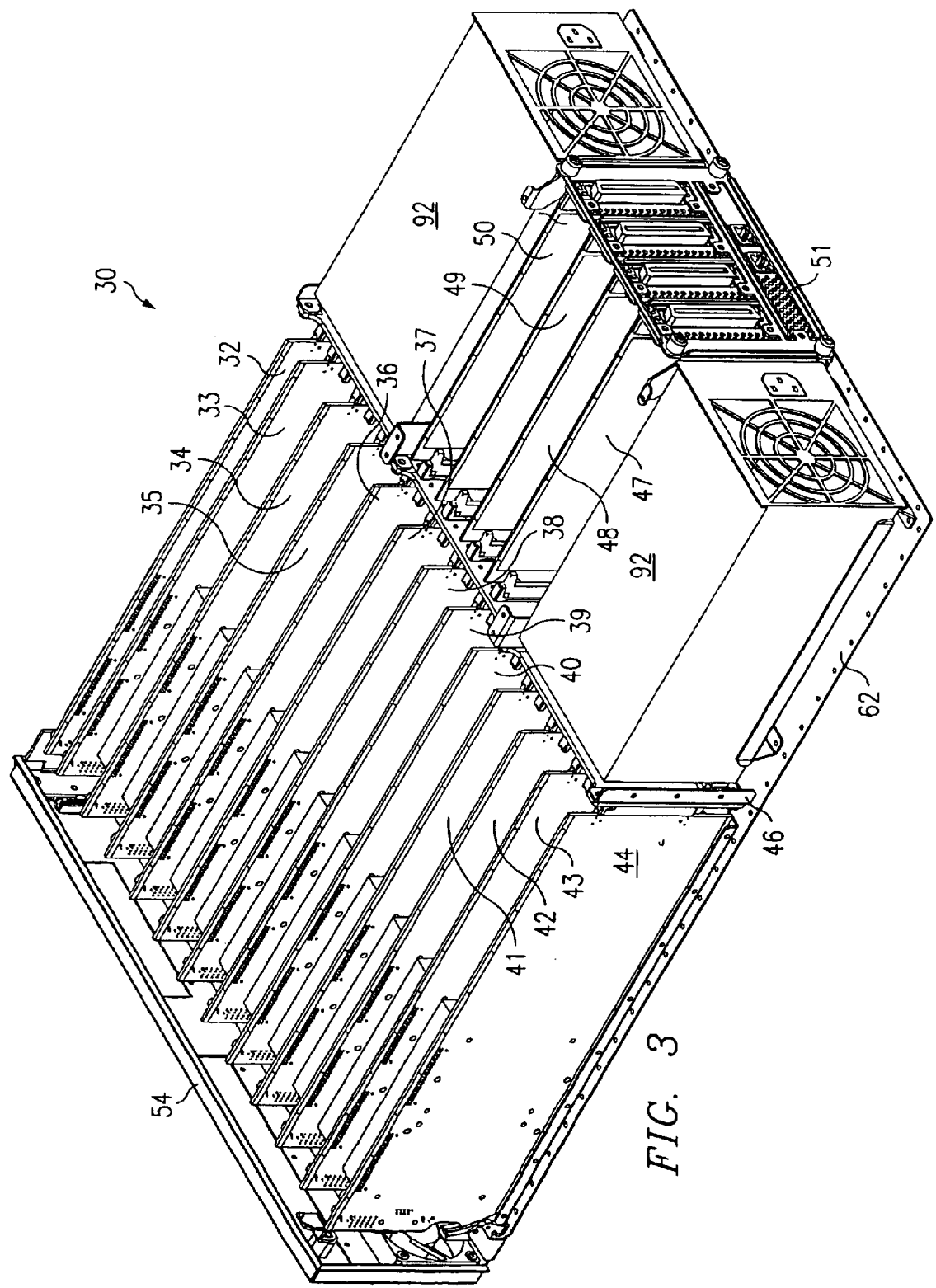
FIG. 3 is an isometric view, with portions broken away, illustrating the server chassis of FIG. 1.

FIGS. 1–3 illustrate a high-density, multiple server chassis 30, in accordance with a particular embodiment of the present invention. Server chassis 30 includes a plurality of server processing cards 32–44 coupled with a midplane 46. A plurality of network interface cards 47–51 are also coupled with midplane 46 and provide processing cards 32–44 with access to one or more communication networks. Server processing cards 32–44 provide the functionality of single board computers which may be employed as rack mounted servers. Server chassis 30 and midplane 46 are adapted to receive up to twenty-four server processing cards and provide access to as many as four independent networks, including the Internet. The number of server processing cards and/or network interface cards 47–51 included with server chassis 30 may vary significantly within the teachings of the present invention. For illustrative purposes, twelve server processing cards 32–43 are included in FIG. 1. An additional processing card 44 is illustrated in FIGS. 2 and 3.

Each server processing card 32–44 is at least partially enclosed within a box build 52. A hinged articulating door 54 is operable to enclose each server processing card 32–44 within box build 52, and provide access to server processing cards 32–44, as needed for provisioning, service, maintenance, and/or replacement. A plurality of box fans 56–61 coupled with articulating door 54 are operable to provide airflow adjacent each server processing card 32–44, for cooling purposes. In accordance with a particular embodiment of the present invention, each box fan 56–61 operates subject to the control of one or more server processing cards 32–44. For example, each fan 56–61 may be configured to run at a relatively high speed if any one of processing cards 32–44 detect the need for additional airflow and/or cooling for one or more of its components (e.g. "high-temperature condition"). Accordingly, one or more fans 56–61 may be actuated to one of at least three operating speeds in response to the operating characteristics of one or more components of server processing cards 32–44.

In the illustrated embodiment, a plurality of operating temperatures associated with components of each server processing card 32–44 are periodically monitored and used to determine the appropriate operating speed for box fans 56–61. Each box fan 56–61 includes three speed settings: (i) HIGH; (ii) LOW; and (iii) OFF. Furthermore, in a particular embodiment the operating speed of each box fan 56–61 is dependent upon the operating speed of every other box fan 56–61. Therefore, in this embodiment, if any one of server processing cards 32–44 detect a high temperature condition, each fan 56–61 will operate at high speed for at least a predetermined minimum period of time. However, it will be recognized by those of ordinary skill in the art that each box fan 56–61 may be configured to operate independently of one another, or subsets of fans 56–61 may be configured to operate in tandem, subject to the control of one or more processing cards.

In alternative embodiments of the present invention, box fans 56–61 may include two speed fans, or fans having more than three speeds. Variable speed controllers which allow the fan speed of any particular box fan to be "fine tuned," to suit various operating characteristics may also be used, in accordance with a particular embodiment of the present invention. Such variable speed controllers may be configured such that the speed of each box fan may be adjusted independently of the others, or each fan may be configured to rotate at approximately the same speed, simultaneously.

Box build 52 includes a base 62 forming a lower portion of box build 52. In the illustrated embodiment, box build 52 and base 62 are fabricated from. plated steel. Box build 52 and articulating door 54, in combination, provide the ability to protect server processing cards 32–44 from ambient environment and/or damage. When articulating door 54 is in the closed position, box fans 56–61 may be used to draw air from the ambient environment, through articulating door 54. The air is exhausted through a back plate 64 of box build 52. In the illustrated embodiment, box fans 56–61 include a bank of six, three-inch fans. It will be recognized by those of ordinary skill in the art that the number, size and configuration of fans associated with server chassis 30 may be significantly altered within the teachings of the present invention. In a particular embodiment, each box fan 56–61 includes a tachometer output having an interface coupled with midplane 46, and the interruption of service of any particular fan may be automatically and promptly detected.

Articulating door 54 includes a printed circuit board ("PCB") 66 which allows for the viewing of LED indicator lights associated with server processing cards 32–44, by an operator standing in front of articulating door 54 (opposite server processing cards 32–44). Recessed windows 68 include slightly "smoked" translucent material, such that the associated LED indicator lights are reasonably visible through articulating door 54.

In the illustrated embodiment, server chassis 30 measures approximately 17.3 inches wide by 25.5 inches deep, by 5.25 inches high. The environmental operating temperature is within the approximate range of 0° C. to 40° C. (32° F. to 104° F.). Server chassis 30 may be operated at altitudes exceeding ten thousand feet above sea level.

Midplane 46 includes two power supply mounting mechanisms 91 (see FIG. 7), which facilitate the installation of two load-balance, hot-swappable power supplies 92. Each power supply 92 includes enough power to operate a fully populated (e.g. twenty-four server processing cards) midplane 46, in case one of the two power supplies 92 fails. Accordingly, server chassis 30 may be operated using a single power supply 92, with an optional upgrade to a second power supply.

Each power supply 92 includes an integral cooling fan with an automatic speed control based upon ambient temperature. Each power supply 92 is designed to be compliant with the MPS SSI power supply specification. This is a publicly released specification developed by the Server System Infrastructure organization (SSI). In a particular embodiment, power supplies 92 may include power supplies as manufactured Delta Corporation (model #DPS-450CB-1B).

Figure 4:
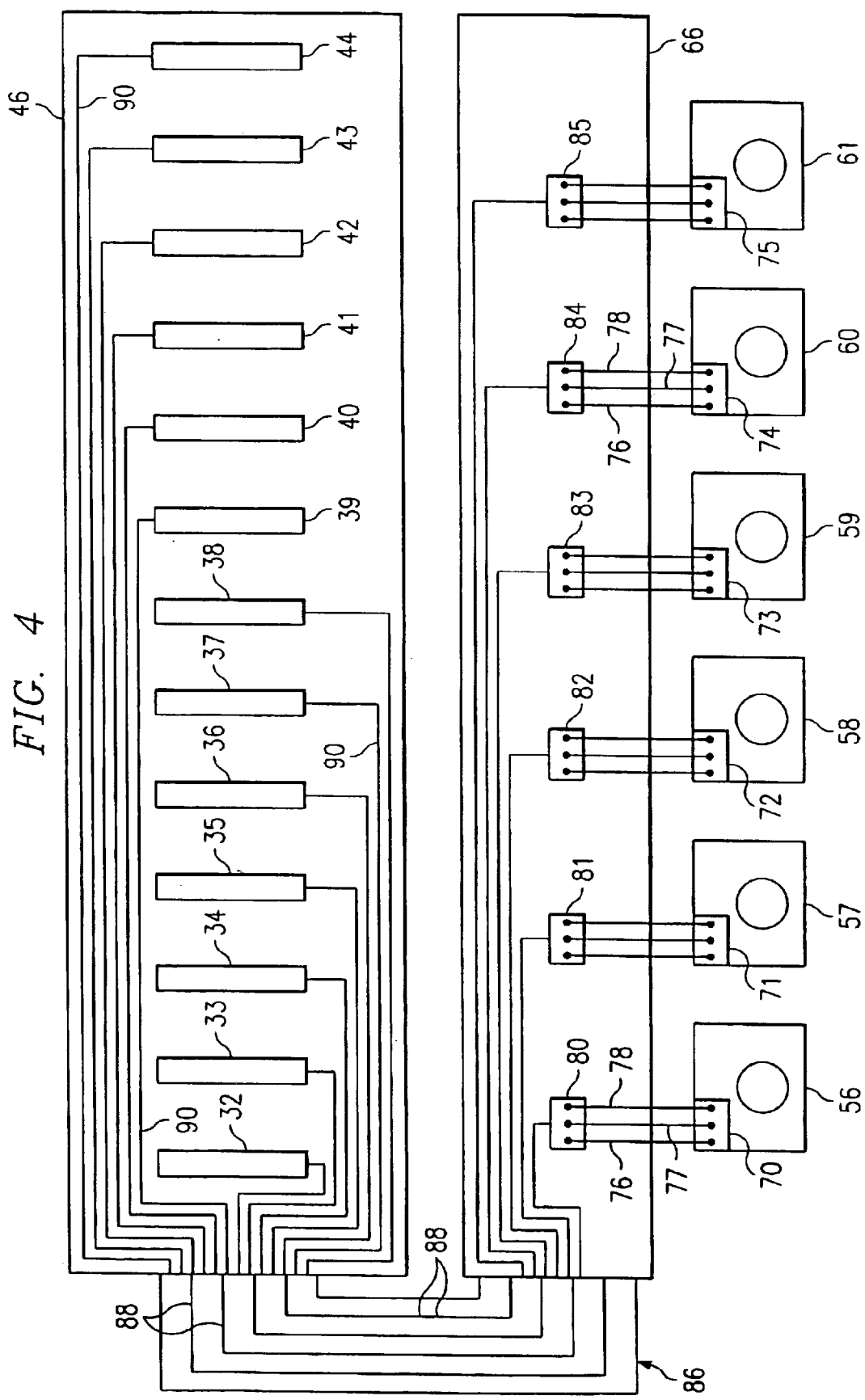
FIG. 4 is a wiring and control diagram illustrating a midplane coupled with a plurality of server chassis cooling fans, in accordance with a particular embodiment of the present invention.

FIG. 4 illustrates a partial wiring and control diagram regarding the control and operation of box fans 56–61. Each box fan 56–61 includes a corresponding control module 70–75, respectively. For the purposes of this application, the term "module" includes hardware, software, and/or logic operable to accomplish the functionality associated with the module being described. A plurality of control wires 76–78 are coupled with and terminated at each control module 70–75. Each control wire 76–78 is also coupled with and terminated at control modules 80–85, associated with printed circuit board 66. Control modules 80–85 are coupled with PCB 66. Each control module is coupled with at least one embedded trace 87 of PCB 66. Traces 87 of the illustrated embodiment, are each coupled with a ribbon cable 86. Ribbon cable 86 couples PCB 66 with midplane 46.

Server processing cards 32–44 are each coupled with midplane 46. Midplane 46 includes a plurality of traces 90, which couple server processing cards 32–44 with ribbon cable 86, and PCB 66. In the illustrated embodiment, each server processing card 32–44 is illustrated as being coupled with a single trace 90. However, each server processing card 32–44 may be coupled with a plurality of traces 90 or one or more server processing cards may share a common trace 90. Traces 90 communicate various signals among and between server processing cards 32–44 and midplane 46.

Each trace 90 of the illustrated embodiment is coupled with one or more wires 88 associated with ribbon cable 86. Ribbon cable 86 and associated wires 88 distribute power to PCB 66 and communicate signals between and among PCB 66 and midplane 46. In the illustrated embodiment, ribbon cable 86 includes at least one dedicated wire 88 for each server coupled with midplane 46, which carries general input/output signals (GPIO). Traces 87 distribute power and communicate signals between and among modules 80–85, ribbon cable 86, PCB 66 and/or servers 32–44.

Control wire 76 distributes power from control modules 80–85 of PCB 66 to each respective control module 70–75. In the illustrated embodiment, each control wire 76 includes a two-pair conducting wire operable to provide twelve-volt power to each box fan 56–61. Control wire 77 is a ground wire coupling each control module 80–85 with a corresponding control module 70–75, respectively. Control wire 78 provides signaling between and among each control module 80–85 with an associated control module 70–75, respectively. Control wire 78 provides at least one-way signaling, and in particular embodiments, may provide at least two-way signaling between control modules 70–75 and 80–85, respectively.

GPIO signals which originate at any one or more of servers 32–44 are collected at midplane 46. In a particular embodiment, at least one common GPIO wire 88 may extend from midplane 46 to each control module 80–85. Therefore, if the GPIO signal is activated by any particular server indicating a high temperature condition, all fans 56–61 will actuate to HIGH. In alternative embodiments, each fan and/or group of fans will include dedicated GPIO wires such that one fan or a subset of fans may operate independently of the others, to allow cooling to particular servers and/or server processing card components, as needed.

The coupling between various components of FIG. 4 and the particular number, size and configuration of control wires, traces, cables and modules may be significantly altered, within the teachings of the present invention. In fact, many configurations in which a signal may be communicated from one of servers 32–44, to one or more box fans 56–61 to actuate and/or adjust their speed in response to the signal, is suitable for use within the teachings of the present invention. The particular layout, size, number, and/or configuration of wires, traces, control wires, busses, hubs and or switches which facilitate the communication of the signal(s), is not limited to the illustrated embodiments.

Figure 5:
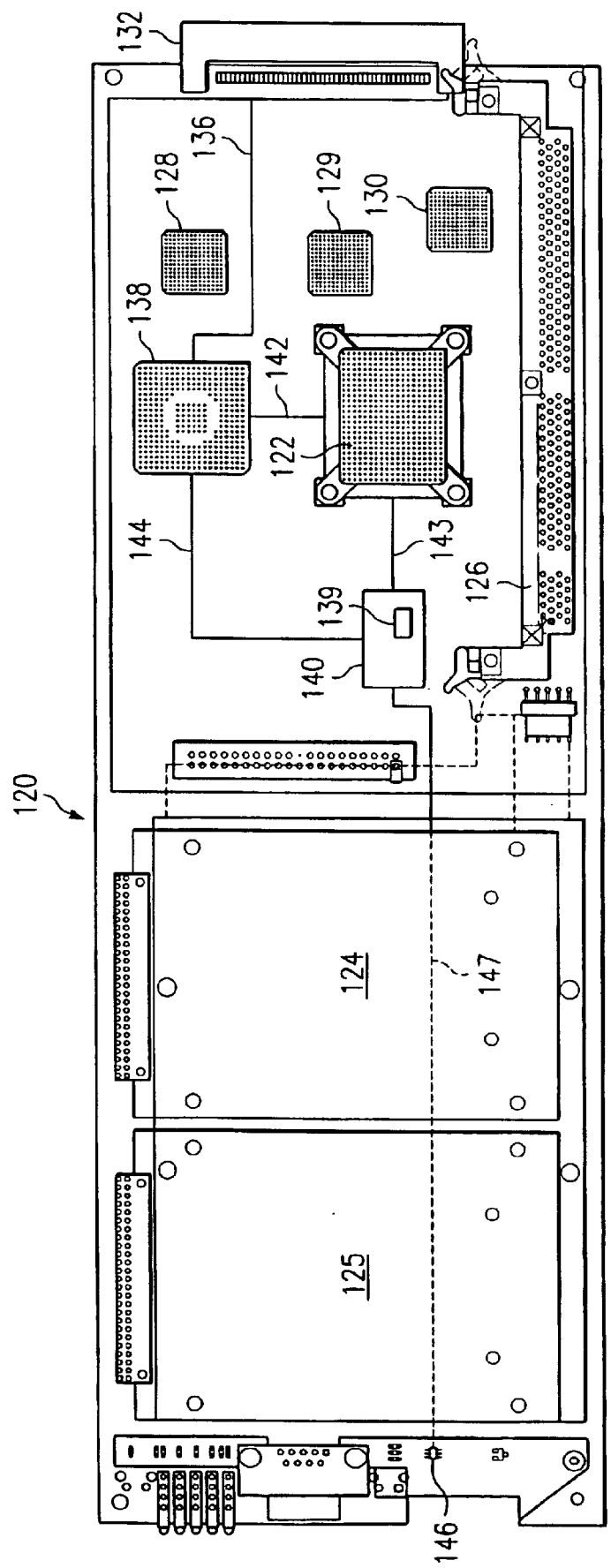
FIG. 5 is a schematic drawing, with portions broken away, illustrating a server processing card of the server chassis of FIG. 1, in accordance with a particular embodiment of the present invention.
Figure 6:
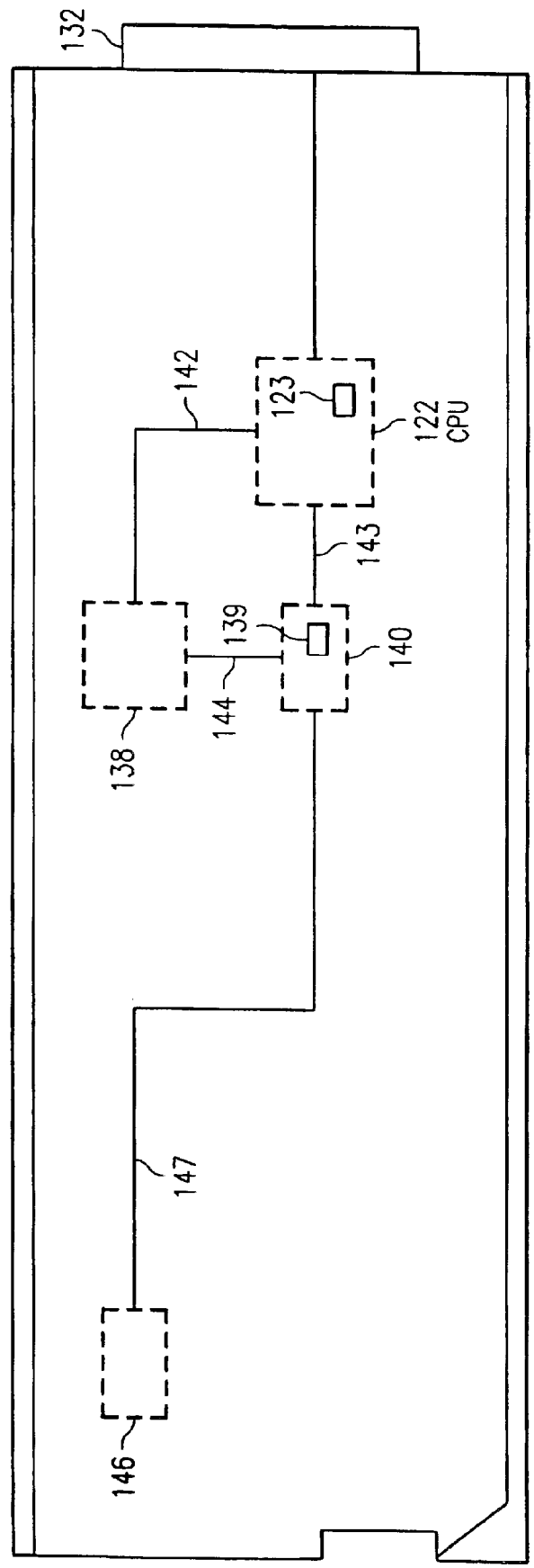
FIG. 6 is a wiring and control diagram illustrating the server processing card of FIG. 5, in accordance with another embodiment of the present invention.

FIGS. 5 and 6 are schematic. drawings, with portions broken away, illustrating components of server processing card 32. In the illustrated embodiments of the present invention, server processing cards 32–44 are configured and function similarly. Therefore, server processing card 32 will be described in detail, for illustrative purposes. However, all server processing cards referred to within this specification may include all components and functionality described with regard to server processing card 32.

Server processing card 32 is a single board computer upon which all of the requisite components and devices may be coupled to enable processing card 32 to function and operate as a server hosting a wide array of applications including, without limitation, Internet based applications. Each server processing card within a particular chassis 30, share common midplane 46 through which power and connectivity passes. Server processing card 32 is configured as a powerful computer which may be connected to the Internet and be operable to store audio, video, data graphics and/or text files. Such files may be displayed to a user via protocols including, without limitation, hypertext transfer protocol (http). Each server processing card 32 includes a printed circuit board ("PCB") 120, coupled with a central processing unit ("CPU") 122, a disk drive 124, a dynamic memory integrated circuit 126, and network interface integrated circuitry 128–130.

Central processing unit 122 performs the logic, computational and decision making functions of processing card 32. Many types of central processing units with various specifications may be used within the teachings of the present invention. In the illustrated embodiment, CPU 122 includes a Crusoe TM 5600, 633 MHz CPU, as manufactured by Transmeta. In fact, many central processing units with comparable processing power to a Pentium III, as manufactured by Intel, may be used within the teachings of the present invention. For example, the Crusoe TM 5800 may also be used.

CPU 122 of the present invention may include the ability to adapt its processing speed to the processing load placed upon it. In other words, CPU 122 may vary its speed as appropriate to handle any given processing load, whereas many other processors simply include ON or OFF capabilities. In a particular embodiment, CPU 122 includes a maximum continuous power consumption of no more than five watts, and a maximum operating temperature of below approximately 150 degrees Fahrenheit.

In the illustrated embodiment, the maximum operating temperature of CPU 122 is approximately 120° F. Due to its variable speed feature CPU 122 of the present invention will typically consume significantly less than five watts of power. CPU 122 of the illustrated embodiment is compatible with the Intel instruction set such that CPU 122 supports standard X86 operating system.

Disk drive 124 includes electronics, motors, and other devices operable to store (write) and retrieve (read) data on disk media. In the illustrated embodiment, disk drive 124 includes a two and one-half inch IBM 9.5 mm notebook hard drive. A second two and one-half inch disk drive 125 may be installed upon a given server processing card 32. The use of disk drive 125 is optional, and increases the capacity and functionality of server processing card 32, and allows for drive data redundancy.

At least two 5 to 30 gigabyte—two and one-half inch hard drives may be provided with server processing card 32, in accordance with the teachings of the present invention. Alternatively, a 10 to 75 gigabyte, three and one-half inch hard drive may be installed upon server processing card 32, in lieu of two and one-half inch drives B6 and 87. Many other hard drives are suitable for use within the teachings of the present invention. In fact, in alternative embodiments, many hard drives having a maximum operating temperature of approximately 125° F. and a maximum continuous power output of approximately 2.5 watts may be substituted for disk drive 124 of the present invention. Accordingly, a plurality of configurations for server processing cards 32 are envisioned within the teachings of the present invention.

In another embodiment, each server processing card 32 is equipped with a single, three and one-half inch disk drive, which offers greater spindle speed and product life. Alternatively, two and one-half inch disk drives provide greater density and lower power requirements. In a particular embodiment, the three and one-half inch disk drive may include an IBM DeskStar or the two and one-half inch disk drives may include an IBM TravelStar hard drive. A total of one hundred and sixty-eight server processing cards having a three and one-half inch disk drive may be mounted in a standard industry rack.

Server processing card 32 also includes a dynamic memory integrated circuit, or memory 126. Memory 126 includes a dual in-line memory module ("DIMM"), to provide the appropriate speed and bandwidth for network communication. In a particular embodiment, memory 126 includes a standard one hundred and sixty-eight pin connector. The storage capacity of memory 126 may be approximately 64 MB RAM, or greater.

Three interface integrated circuit chip sets 128–130 are coupled with printed circuit board 120. Chip set 128 may be referred to as public network interface integrated circuit since it corresponds with the operation of the public network (e.g. the Internet). Similarly, chip set 129 may be referred to as the private network interface integrated circuit and chip set 130 may be referred to as the management network interface integrated circuit since they correspond to the private network and management network operations, respectively. Collectively, chip sets 128–130 may be configured to provide three 10/100/1000 megabits per second Ethernet network interfaces. Additional chip sets may be included with server processing card 32 in order to support more than three independent networks.

A high density, eighty-pin SCA connector 132 is used to couple server processing card 32 with a corresponding high density, eighty-pin SCA connector 45 associated with midplane 46 (see FIG. 7). Connector 132 includes a "blind mate" feature which provides self-alignment properties for simplified installation and removal of processing card 32 from midplane 46. Connector 132 also includes pins suitable for hot swap insertion and extraction of server processing cards 32–44. Connectors 132 and 45 also include built-in serial connectors for managing network traffic. In other words, connector 132 and 45 are appropriately sized and configured to accommodate a serial connection independent of the above referenced Ethernet connections and any other required power/communications ports.

Connector 132 of server 32 is coupled with controller 138 using an embedded trace 136. Trace 136 is used to transmit a GPIO signal to connector 132, in response to CPU 122 detecting a temperature above a predetermined maximum. CPU 122 is also coupled with a controller 138, and a sensor chip 140 using traces 142 and 143, respectively. Sensor chips 140 includes registers which record the operating temperatures. Trace 144 couples controller 138 and register 140.

In the illustrated embodiment, trace 142 includes a PCI bus and trace 144 includes an I²c bus. Controller 138 includes the ability to control PCI, I²c, and/or IDE communications, and may include modem, audio and power controllers. A South Bridge Controller as manufactured by Acer Labs Incorporated (ALI) (product number 1535) may be used in accordance with the present invention.

In a particular embodiment, controller 138 controls/monitors PCI bus 142 and I²c bus 144. Periodically and/or at predetermined time intervals, CPU 122 issues a command to controller 138 over PCI bus 142 instructing controller 138 to issue a command to sensor chip 140 to read an operating temperature associated with server processing card 32. CPU 122 may include an integral temperature sensor. Therefore, the operating temperature recorded at sensor chip 140 may include a core temperature of CPU 122. The temperature recorded at sensor chip 140 is communicated to controller 138 using I²c bus 144. Controller 138 communicates the temperature to CPU 122 using PCI bus 142.

Sensor chip 140 continuously and/or periodically monitors the temperature of CPU 122 using embedded trace 143. Therefore, in a particular embodiment, embedded trace 143 may include a thermocouple. In order to store the record temperature, sensor chip 140 includes volatile memory (e.g. a register) and sensor chip 140 continuously monitors and stores the core temperature of CPU 122.

CPU 122 issues a request to controller 138 to read the CPU core temperature every five seconds. CPU 122 receives the temperature reading from controller 138 and determines what action(s), if any, need to be taken regarding the operation of fans 56–61. If the CPU core temperature of CPU 122 is above 85° C., CPU 122 issues a GPIO signal over trace 136 indicating that each fan 56–61 should be actuated to HIGH. CPU 122 also monitors the operation of and speed of fans 56–61.

If CPU 122 determines that the CPU core temperature is below 85° C. and also determines that fans 56–61 are operating at HIGH speed, CPU 122 sets a timer for the partial slow down of the fans. For example, in the illustrated embodiment, CPU 122 sets a five minute timer. If the CPU core temperature remains below 85° C. for the five minute period, then CPU 122 transmits a signal to return fans 56–61 to LOW. If CPU 122 receives a core temperature reading exceeding 85° C. during the five minute countdown, then the timer is stopped and reset to five minutes. The timer does not begin counting again until CPU 122 records a CPU core temperature below 85° C.

As previously discussed, each server processing card 32–44 functions similarly. Therefore, if a CPU associated with any server processing card detects a CPU core temperature above 85° C., all fans are actuated to HIGH. The speed of the fans is not reduced to LOW as long as any CPU associated with any respective server processing card is recording a CPU core temperature above 85° C. and/or any CPU is within a five minute countdown period.

In the illustrated embodiment, there are at least three temperature readings available to CPU 122. As discussed above, the CPU core temperature is periodically measured by sensor chip 140. Sensor chip 140 also includes an integral temperature sensor 139 which allows CPU 122 to measure the temperature adjacent sensor chip 140. An additional temperature sensor 146 is located adjacent disk drive 145, and coupled with sensor chip 140 using trace 147. In accordance with a particular embodiment of the present invention, CPU 122 reads operating temperatures from each of the three temperature sensors. If any of the three operating temperatures read by CPU 122 is greater than or equal to a predetermined maximum, CPU 122 transmits a signal, via controller, which causes the fans to increase to HIGH. In alternative embodiments, each temperature sensor region may have different operating temperature maximums.

Therefore, CPU 122 may compare the operating temperature recorded at each temperature sensor with a different maximum value, in order to determine whether to increase the speed of the fans.

The three temperature readings available from temperature sensors 123, 139 and 146 of FIG. 6 are intended to distribute the available readings across the surface area of processing card 32. In this manner, increased temperatures and/or temperatures above predetermined maximums at various distributed locations are read by CPU 122. Therefore, if any component located on or near a particular processing card heats up, CPU 122 may detect it and react accordingly. It will be recognized by those of ordinary skill in the art that the number, size, configuration and/or location of the temperature sensor(s) may be significantly altered, within the teachings of the present invention. Accordingly, one or more temperature sensors may be located practically anywhere within and/or adjacent chassis 30, in order to detect increased temperatures and potential trouble. Such sensors may be coupled with processors associated with server processing card 32 and/or 33–44 to allow such processors to adjust the speed of one or more fans in response to high temperature readings.

Temperature sensors may be coupled with other components of sever processing cards 32–44 and/or server chassis 30. Such components include, without limitation, associated hard drives, DIMMs and/or power supplies.

In a particular embodiment, a module resident upon CPU 122 of server processing card 32 continuously and periodically monitors the core temperature of CPU 122 using sensor chip 140. When a pre-determined threshold core temperature of CPU 122 is reached, a signal is communicated from server 32 to box fans 56–61 to spin at HIGH speed. When server 32 detects that the core temperature of CPU is equal to or below a predetermined cool-down temperature, CPU sets a timer associated with fans 56–61. The timer includes a predetermined time interval. If the core temperature of CPU 122 stays equal to, or below the predetermined threshold core temperature and/or the predetermined cool-down temperature, then server 32 communicates a signal to fans 56–61 to reduce their speed. However, if the core temperature rises above the predetermined threshold core temperature, and/or the predetermined cool-down temperature, the timer is reset to the predetermined time interval.

FIGS. 7 and 8 illustrate components of midplane 46. On its front face 100, midplane 46 includes a plurality of server processing card connectors 45 which facilitate the installation of up to twenty-four server processing cards 32. In a particular embodiment, server processing card guides are installed at 0.7 inch center to center dimensions. Alternatively, up to twelve server processing cards 32 including optional three and one-half inch disk drives may be installed upon midplane 46 using every other connector 45.

Rear face 102 of midplane 46 includes a pair of power supply mounting mechanisms 91 which accommodate the coupling of power supplies 92 with midplane 46. Rear face 102 of midplane 46 also includes a plurality of network interface card connectors 104–109. Midplane 46 of server chassis 30 includes all of the power and connectivity requirements to accommodate up to twenty-four server processing cards.

Midplane 46 of the illustrated embodiment is considered "passive" because it includes no active components which can fail. Instead, midplane 46 includes the necessary wiring to connect each respective server processing card 32 with its corresponding network interface card and PCB 66. PCB 66 includes the appropriate printed circuitry to distribute data and power necessary for the operation of server chassis 30. For example, midplane 46 distributes power to components of server processing cards 32, network interface cards 104–109, and/or PCB 66. Additionally, midplane 46 distributes data and/or communications signals between server processing cards 32, network interface cards 104–109 and/or PCB 66.

Midplane 46 also includes a ribbon cable connector 134 which couples ribbon cable 86 with midplane 46. Connector 134 is operable to distribute power and control signals from midplane 46 to PCB 66 of chassis 30. This accommodates the operation of the PCB 66 and fans 56–61 associated with articulating door 54.

Figure 9:
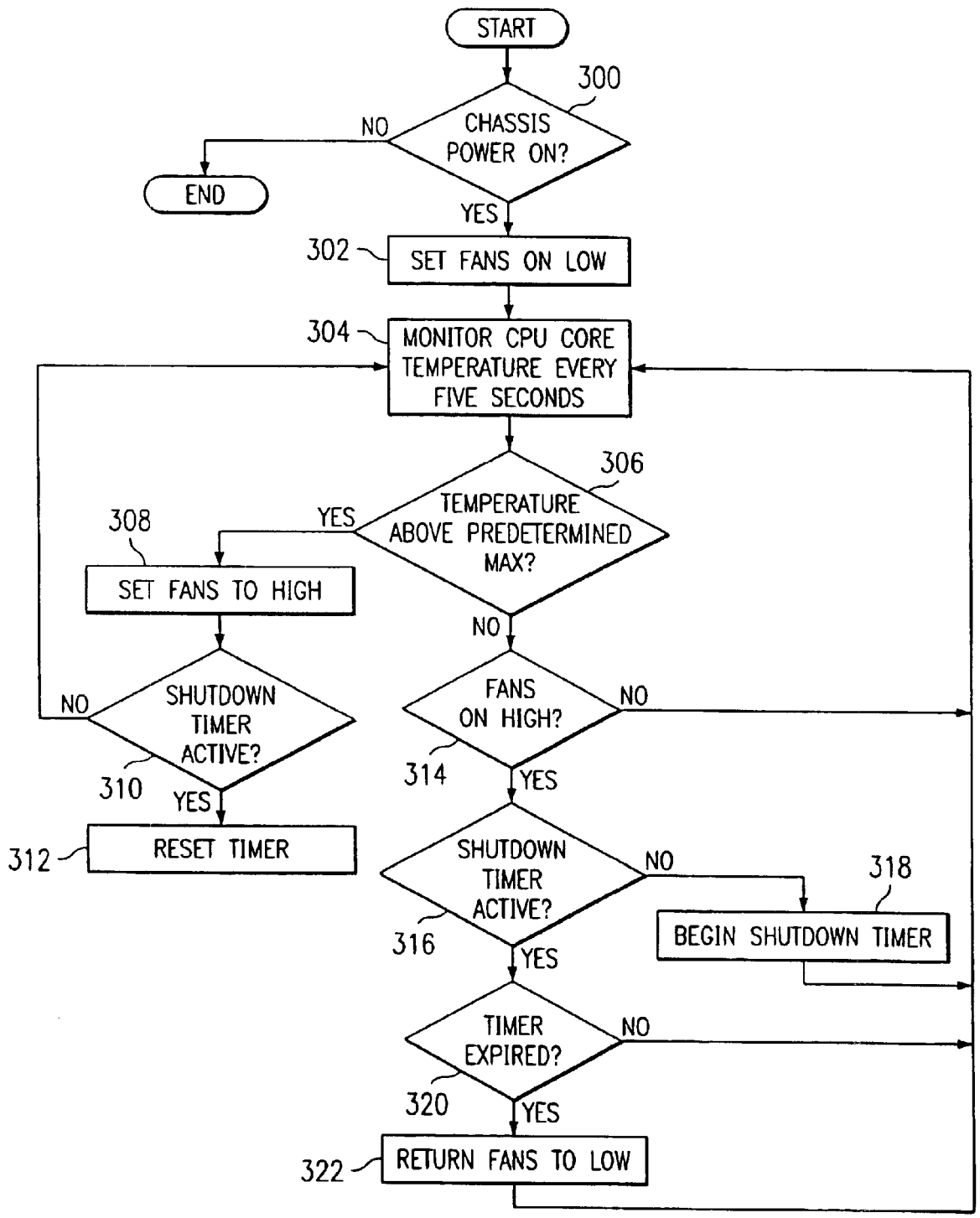
FIG. 9 is a flow diagram illustrating a method for controlling a plurality of server chassis cooling fans, in accordance with a particular embodiment of the present invention.

FIG. 9 illustrates a method for controlling a plurality of cooling fans, in accordance with a particular embodiment of the invention. The method begins at step 300, where a determination is made whether or not the system is powered ON. If the power to the chassis is OFF, the method ends. If the system is running, the fans are set to a LOW speed at step 302. Therefore, during system operation, the fans are always rotating at at least a minimum speed. When the system is shut down, the fans are OFF. In an alternative embodiment, the fans may be configured to run continuously after system shutdown, or for a predetermined cool-down period after system shutdown. Furthermore, the fans may be configured to shut down when the operating temperature of any particular component(s) of the system is below a predetermined maximum, and/or within an acceptable range.

Next, at step 304, the CPU core temperature is monitored continuously every five seconds. At step 306, the CPU core temperature is compared with a predetermined maximum temperature. If the CPU core temperature is above the predetermined maximum, the fans are set to HIGH at step 308. It will be recognized by those of ordinary skill in the art that the components and parameters being measured, and the actions being taken in response, may be significantly altered within the teachings of the present invention. For example, in the illustrated embodiment, the CPU core temperature is being monitored. In an alternative embodiment, the temperature associated with another component(s) may be monitored in lieu of and/or in addition to the CPU core temperature. Furthermore, other parameters other than the operating temperature of one or more components, may be used to determined the operation of the cooling system. Such parameters may include, but are not limited to, the amount of time the system and/or any particular component has been active, and/or the time period since the cooling system has been shut down.

The temperature "sampling" period (e.g., frequency of temperature measurements of five seconds) may also be modified within the teachings of the present invention. In the illustrated embodiment, the temperature is monitored every five seconds during operation of the chassis. In alternative embodiments, this time frame may be increased/decreased depending upon the particular application, and/or sensitivity of the equipment, and/or data. The sampling period may also vary during operation according to one or more system parameters. For example, the sampling may be decreased in response to a particular "trouble" signal. Therefore, the system may be monitored more closely after one or more indicators suggest that trouble is likely.

In the illustrated embodiment, fan speeds include "OFF," "LOW," and "HIGH." The fans remain OFF when the system is powered off. The fans are actuated to LOW setting as soon as power is detected at the chassis. After the system reaches a predetermined maximum temperature, the fan speed is increased to HIGH. In alternative embodiments, fans having fewer or more than three speed settings may be used, including variable speed fans having practically any number of settings between "OFF" and the highest available setting. Also, the fan speed may be increased and/or decreased gradually, according to various temperature readings or other parameter measurements taken at one or more system components. For example, the fan speed may be increased to a "medium" setting in response to a particular temperature reading and increased to HIGH in response to a higher temperature reading.

As previously discussed, in the illustrated embodiment, the speed of each fan is dependent upon the speed of all other fans. Accordingly, the six fans of the illustrated embodiment are controlled as if they were one. However, in alternative embodiments, at least one and as many as all fans may operate independently of the others. Therefore, one or more fans may be configured to begin rotating when a particular component (e.g., adjacent component) reaches a predetermined temperature. One or more additional fans may be configured to begin rotation upon a higher temperature reading of the same component and/or a predetermined maximum temperature reading of another component is reached.

At step 310, the system determines whether or not the shutdown timer is active. The shutdown timer will be described later in more detail. Generally, however, the shutdown timer begins when the fans are set to HIGH and the temperature drops below a predetermined minimum temperature. The shutdown timer is configured to reduce the speed of the fans after a predetermined time interval. Therefore, if the temperature is above the predetermined maximum, and the shutdown timer is active, the system resets the timer at step 312. After being reset, the timer will not begin to count down again until a request to begin shutdown timer is received (e.g. step 318).

If the CPU core temperature is not above the predetermined maximum temperature at step 306, the system determines whether or not the fans are running on high speed at that particular time, at step 314. If the fans are not running on high speed, the method returns to step 300.

Next, at step 316, the system determines whether the shutdown timer is active. In the illustrated embodiment, the shutdown timer is active when the fans are running on HIGH, and the CPU core temperature returns to an acceptable value. The shutdown timer is configured to wait a predetermined time period before returning the fans to LOW. If the shutdown timer is not active, the CPU begins the timer to shutdown, at step 318.

If the shutdown timer is active, the system determines whether or not the timer has expired, at step 320. If the timer has expired (e.g. the five minute shutdown period is reached) the a signal is sent to the fans to return to LOW speed, at step 322. If the timer has not expired, the method returns to step 304 to continue monitoring the CPU core temperature.

In accordance with a particular embodiment of the present invention, a module including software and/or hardware that is resident upon each server processing card monitors its respective core CPU temperature using a temperature sensor. When a predetermined temperature threshold is reached on any particular server processing card CPU, a signal is generated that instructs all of the fans of the server chassis to spin at a higher revolutions per minute (RPM) rate. Upon cooling, the module clears the signal, resulting in the chassis fans slowing down to a slower RPM. In particular embodiments, the signal may include a hardware GPIO signal. The GPIO signal is communicated from a particular server 32–44, to that server's associated connector 132, to connector 45 and through ribbon cable 86.

Accordingly, the signal to spin the fans at the faster rate is implemented through a "voting scheme". If any particular server processing card determines that the fans should spin at the higher rate, the fans will stay at the higher RPM speed. Having all fans spin at the same RPM based upon a signal from any one server processing card prevents uneven air movement which could result from running only selected fans at the higher RPM. Therefore, uneven heat dissipation and uneven cooling of the processors within the chassis is reduced.

Figure 10:
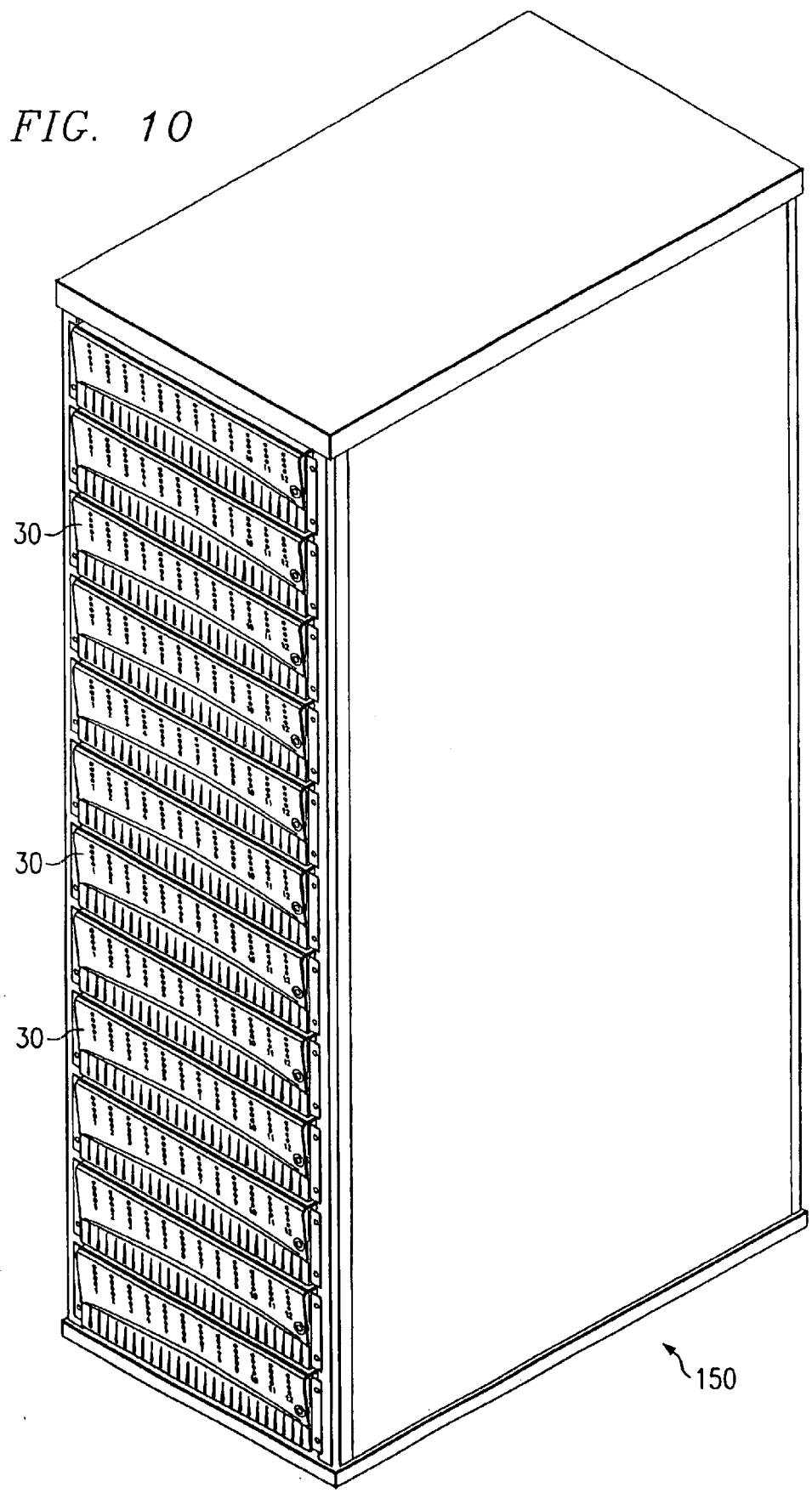
FIG. 10 is an isometric view, illustrating a server rack having a plurality of server chassis, in accordance with a particular embodiment of the present invention.

FIG. 10 illustrates a server rack 150 including a plurality of server chassis 30. In a particular embodiment, each server chassis 30 consumes a total of 3U (1U=1.75 inches) of space. Accordingly, as many as fourteen server chassis 30 may be installed in an industry standard 42U rack. Each chassis 30 comes equipped with the ability to support redundant, load-balanced power supplies and RJ-21 style connectors which allow the consolidation of the requisite Ethernet cables to a significantly smaller number of cables than those required through the use of conventional RJ-45 connectors.

The teachings of the present invention may be used to provide more than three hundred and thirty-six servers in a standard six foot equipment rack 150. The design and configuration of server processing cards 32–44 accommodate an extremely low total cost of ownership (TCO). For example, twelve or twenty-four server processing cards 32–44 which are ultra-compact, low-power single board computers which share a common midplane, power and cable management system.

Server rack 150 is configured to provide a user friendly operating environment. For example, server rack 150 may be co-located at the physical location of an internet service provided (ISP) or an applications service provider (ASP). Moreover, due to the ease of use and operation, unsophisticated employees of the ISP/ASP can easily operate and maintain all of the components associated with server rack 150.

The use of server processing card 32 having two, two and one-half inch disk drives allows for the installation of three hundred and thirty-six servers within an industry standard rack having 42U of usable interior space (standard industry rack). For purposes of this specification, a standard industry rack has the approximate dimensions nineteen inches wide by six feet high by thirty to thirty-four inches deep.

In a particular embodiment, the teachings of the present invention provide a system and method for providing airflow and/or cooling to a server chassis based upon the operating characteristics of particular components of the server chassis, for example and without limitation, components of a particular server processing card. For example, six fans associated with the server chassis may be dedicated to provide airflow across twenty-four server processing cards. Due to the reduced power requirements and heat output of processors, there is far less need for one or more fans dedicated to cooling a single server processing card and/or other components of the server chassis. Therefore, in accordance with a particular embodiment, a cooling scheme is provided which allows for consistent server chassis cooling as opposed to dedicated server processing card cooling.

Although the present invention has been described in several embodiments, a myriad of changes and modifications may be suggested to one skilled in the art, and it is intended that the present invention encompass such changes and modifications as fall within the scope of the present appended claims.

What is claimed is:

1. A method for controlling a plurality of server chassis cooling fans, comprising:

transmitting first and second requests to first and second server processing cards, respectively, to read first and second operating temperatures, respectively, measured at first and second temperature sensors, respectively;

the first and second temperature sensors being coupled with the first and second server processing cards, respectively;

receiving the first and second operating temperatures at a central processing unit;

comparing the first and second operating temperatures with first and second predetermined maximum operating temperatures, respectively;

transmitting a third request to a plurality of server chassis cooling fans to increase the speed of the server chassis cooling fans if the first operating temperature is greater than or equal to the first predetermined maximum operating temperature or the second operating temperature is greater than or equal to the second predetermined maximum operating temperature; and wherein the first and second server processing cards and the plurality of server chassis cooling fans are disposed at least partially within a server chassis.

2. The method of claim 1, further comprising receiving at least a third operating temperature at the central processing unit, the third operating temperature being associated with a third temperature sensor that is coupled with a third server processing card;

comparing the third operating temperature with a third predetermined maximum operating temperature; and transmitting a fourth request to increase the speed of the server chassis cooling fans if the third operating temperature is greater than or equal to the third predetermined maximum operating temperature.

3. The method of claim 2, wherein at least two of the first, second and third predetermined maximum operating temperatures are equal.

4. The method of claim 1, wherein the first request is transmitted over a PCI bus.

5. The method of claim 1, further comprising receiving the operating temperature from a sensor chip.

6. The method of claim 5, wherein the operating temperature is received over an $I^2c$ bus.

7. The method of claim 1, wherein the third request comprises a GPIO signal.

8. The method of claim 1, wherein the first predetermined maximum operating temperature is equal to the second predetermined maximum operation temperature.

9. A system, comprising:

a plurality of server processing cards each having a respective central processing unit and temperature sensor;

the central processing units being operable to read operating temperatures measured at the temperature sensors;

a printed circuit board coupling each server processing card with a plurality of server chassis cooling fans;

wherein the plurality of server processing cards comprises a first number of server processing cards and the plurality of cooling fans comprises a second number of cooling fans and wherein the first number is greater than the second number; and wherein each of the plurality of server chassis cooling fans is operable to increase speeds of rotation in response to a signal from any of the server processing cards indicating an operating temperature greater than or equal to a predetermined maximum operating temperature.

10. A computer readable medium encoded with logic operable to:

transmit first and second requests to first and second server processing cards, respectively, to read an operating temperature measured at first and second temperature sensors, respectively;

the first and second temperature sensors being coupled with the first and second server processing cards, respectively;

receive the first and second operating temperatures at a central processing unit;

compare the first and second operating temperatures with first and second predetermined maximum operating temperatures, respectively;

transmit a third request to a plurality of server chassis cooling fans to increase the speed of the server chassis cooling fans if the first operating temperature is greater than or equal to the first predetermined maximum operating temperature or the second operating temperature is greater than or equal to the second predetermined maximum operating temperature; and wherein the first and second server processing cards and the plurality of server chassis cooling fans are disposed at least partially within a server chassis.

11. The computer readable medium of claim 10, wherein the logic is further operable to receive the operating temperature from a sensor chip.

12. A system for controlling a plurality of server chassis cooling fans, comprising:

means for transmitting first and second requests to first and second server processing cards, respectively, to read first and second operating temperatures, respectively, measured at first and second temperature sensors, respectively;

the first and second temperature sensors being coupled with the first and second server processing cards, respectively;

means for receiving the first and second operating temperatures at a central processing unit;

means for comparing the first and second operating temperatures with first and second predetermined maximum operating temperatures, respectively;

means for transmitting a third request to a plurality of server chassis cooling fans to increase the speed of the server chassis cooling fans if the first operating temperature is greater than or equal to the first predetermined maximum operating temperature or the second operating temperature is greater than or equal to the second predetermined maximum operating temperature; and wherein the first and second server processing cards and the plurality of server chassis cooling fans are disposed at least partially within a server chassis.

13. The system of claim 12, further comprising means for receiving the operating temperature from a sensor chip.

14. A method for controlling temperature in a server chassis, comprising:

transmitting first, second, and third requests to first, second, and third of at least ten server processing cards, respectively, to read first, second, and third operating temperatures, respectively, measured at first, second, and third temperature sensors, respectively, wherein the first, second, and third temperature sensors are respectively coupled with the first, second, and third server processing cards and at least one of the first, second, and third requests is transmitted over a PCI bus;

receiving, in response to transmitting the requests, the first, second, and third operating temperatures over a midplane circuit board at a central processing unit;

comparing the first, second, and third operating temperatures with first, second, and third predetermined maximum operating temperatures, respectively, at the central processing unit;

transmitting a fourth request to all of at least three server chassis cooling fans to increase the speed of the server chassis cooling fans if the first operating temperature is greater than or equal to the first predetermined maximum operating temperature, the second operating temperature is greater than or equal to the second predetermined maximum operating temperature, or the third operating temperature is greater than or equal to the third predetermined maximum operating temperature; and wherein the server processing cards and the server chassis cooling fans are disposed at least partially within the server chassis.

15. The method of claim 14, and further comprising adjusting at least two of the first, second, and third predetermined maximum operating temperatures to an equal value.

* * * * *